(12) United States Patent
Konno

(10) Patent No.: US 7,190,205 B2
(45) Date of Patent: Mar. 13, 2007

(54) VARIABLE RESISTANCE CIRCUIT

(75) Inventor: Yoshiaki Konno, Isehara (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 59 days.

(21) Appl. No.: 11/068,897

(22) Filed: Mar. 2, 2005

(65) Prior Publication Data

US 2006/0197576 A1    Sep. 7, 2006

(51) Int. Cl.
*H03L 5/00* (2006.01)
(52) U.S. Cl. .................... 327/308; 327/427; 327/334
(58) Field of Classification Search ............... 327/307, 327/308, 334, 427
See application file for complete search history.

(56) References Cited

U.S. PATENT DOCUMENTS 6,229,375 B1 * 5/2001 Koen .......................... 327/308
6,822,502 B2 * 11/2004 Soda .......................... 327/308

OTHER PUBLICATIONS

"Design Principle of CMOS VLSI" by Neil H.E. Weste, Kamran Eshraghian and Tomizawa Takashi, Matsuyama Yasuo 1st Ed., Maruzen, Aug. 30, 1988, pp. 33-37.

* cited by examiner

*Primary Examiner*—Long Nguyen
(74) *Attorney, Agent, or Firm*—Finnegan, Henderson, Farabow, Garrett & Dunner, LLP

(57) ABSTRACT

Values of control signals 61, 62, 63, . . . , 6n, each inputted to an input terminal for operation control 6 of each of transistor elements 4 constituting a variable resistance portion 2, are controlled based upon an input signal 40 and offset signals 52, 53, . . . , 5n generated by an offset provision portion 3. Thus, a ratio of the maximum resistance value to the minimum resistance value can be made large, while using a limited power supply voltage range as a control range.

5 Claims, 15 Drawing Sheets

VARIABLE RESISTANCE CIRCUIT

BACKGROUND OF THE INVENTION

1. Field of the Invention

The present invention relates to a variable resistance circuit. More particularly, the invention relates to a variable resistance circuit using MOS transistors.

2. Description of the Related Art

The variable resistance circuit using MOS transistors is described in "Design Principle of CMOS VLSI" by Neil H. E. Weste, Kamran Eshraghian (original authors), and Tomizawa Takashi, Matsuyama Yasuo (translation supervisors), the first edition, Maruzen, Aug. 30, 1988, p. 33–37.

A current Ids flowing in a MOS transistor in a linear region is expressed by the following equation by defining the gate length as L, the gate width as W, a voltage difference between the gate and the source as Vgs, a voltage difference between the drain and the source as Vds and a gain factor as K'.

$$Ids = K' \cdot (W/L) \cdot \{(Vgs-Vth) \cdot Vds - Vds^2/2\}.$$

When (Vgs−Vth) is larger than Vds, the term of $Vds^2$ can be ignored. The above equation Ids is expressed as follows.

$$Ids = K' \cdot (W/L) \cdot (Vgs-Vth) \cdot Vds$$

Thus, the resistance is expressed as follows.

$$1/\{K' \cdot (W/L) \cdot (Vgs-Vth)\}$$

This resistance becomes a variable resistance of which resistance value can be controlled by Vgs.

In a variable resistance circuit particularly using a MOS transistor in a linear region, the bias voltage Vgs applied between the gate and the source needs to be set at least larger than (Vds+Vth), because the MOS transistor must be operated in the linear region and the gate voltage must be made equal to or larger than the sum of a voltage difference Vds generated across the resistance and the threshold voltage Vth of the MOS transistor.

On the other hand, the variable range of the resistance is limited within a range of a power supply voltage Vdd. For this reason, the voltage range which can be used for adjusting the resistance is limited within (Vdd−(Vds+Vth)) which is a difference between the power supply voltage and the minimum bias voltage necessary for operating the MOS transistor in the linear region. In this case, the ratio between the maximum and minimum values of the resistance of the MOS transistor, when the term of $Vds^2$ is ignored, becomes (Vdd−Vds−Vth):Vds.

For example, when Vdd=5 V, Vth=0.7 V, Vds=0.5 V and the source voltage Vs=0 V, then the ratio=4.3:0.5. In recent years, the MOS transistor has been scaled down and breakdown voltage has also been decreased, thereby lowering the power supply voltage. Thus, the voltage range as the control voltage has also been reduced. When Vdd=3.3 V, the ratio=2.6:0.5.

FIG. 1 shows an example of a common variable resistance circuit 200.

The variable resistance circuit 200 is structured by a single N-type MOS transistor 201 (NMOS 77). Reference numeral 71 denotes a gain amplifier. Reference numeral 202 denotes an input terminal.

FIG. 2 shows a relationship between a gate voltage of the N-type MOS transistor 201 and a control signal voltage serving as a control signal 203.

FIG. 3 shows a relationship between a resistance value of a variable resistance observed at a pair of terminals D and S (204) and the control signal voltage.

When the maximum resistance value is defined as R0 and the minimum resistance value as R1, the ratio of the maximum value to the minimum value is R0/R1.

Even if the size of NMOS 77 is made n-fold so as to reduce the minimum resistance value to R1/n, since the maximum value of the resistance value becomes R0/n, the ratio is just R0/R1.

Accordingly, an object of the present invention is to provide a variable resistance circuit which enables the ratio of the maximum resistance value to the minimum resistance value to be large, while using a limited power supply voltage range as a control range.

SUMMARY OF THE INVENTION

According to the present invention, there is provided a variable resistance circuit comprising: a variable resistance portion having a plurality of transistor elements connected in parallel and having a pair of terminals to provide a combined resistance of the transistors; and an offset provision portion for adding an offset signal to a control signal to control each of the transistor elements, the control signal inputted from a control terminal, wherein the control signal added the offset signal varies the combined resistance between a pair of terminals.

The variable resistance portion may further comprise a fixed resistance connected to the transistor elements in parallel.

The transistor elements of the variable resistance circuit may be configured by MOS transistors.

The offset signal may be a voltage signal for adding to an input voltage inputted to the input terminal as the control signal.

The offset signal of the offset provision portion may also be a signal for adding to an input current inputted into the input terminal as the control signal.

According to the present invention, an input value of the control signal inputted to the input terminal for operation control of each of the transistor elements constituting the variable resistance portion is varied based on the input value and the offset signal generated by the offset provision portion, and the operation range of each transistor element can be shifted, thereby enabling the ratio of the maximum to minimum values of the combined resistance observed at the pair of terminals of the variable resistance portion, to be made larger by several times or more in comparison with the conventional case, with a limited power supply voltage range being used as a control range.

In addition, one of the transistor elements constituting the variable resistance portion is replaced by a fixed resistance, thereby simplifying input adjustment for the control signal due to adding the offset signal.

The above and other objects, effects, features and advantages of the present invention will become more apparent from the following description of embodiments thereof taken in conjunction with the accompanying drawings.

DETAILED DESCRIPTION OF THE PREFERRED EMBODIMENTS

Hereafter, the best embodiments according to the present invention will be described in detail with reference to the drawings.

First Embodiment

A first embodiment according to the present invention will be described with reference to FIGS. 4 to 9.

(Circuit Configuration)

Figure 4:
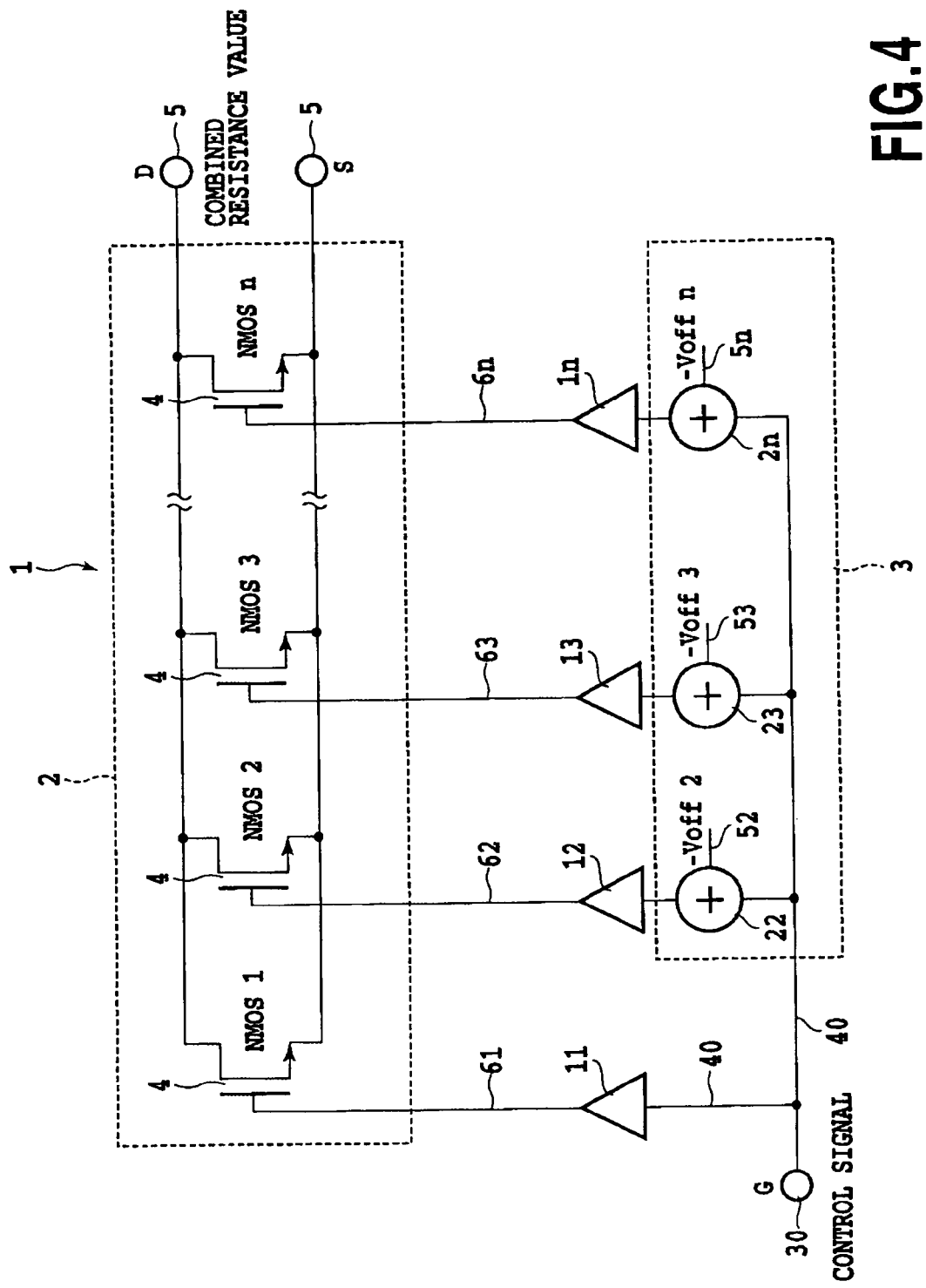
FIG. 4 is a circuit diagram of a first embodiment of the variable resistance circuit according to the present invention.

FIG. 4 shows a configuration of a variable resistance circuit 1.

The variable resistance circuit 1 is roughly divided into a variable resistance portion 2 and an offset provision portion 3.

The variable resistance portion 2 is structured by a plurality of transistor elements 4 (here, the first, second, third and n-th transistor elements out of n pieces being shown) connected in parallel and operable in a linear and nonlinear region, and a pair of terminals 5 (a drain terminal D and a source terminal S) for outputting a combined resistance of the transistor elements 4. As the transistor elements 4, N-type MOS transistors 4 (NMOS 1, NMOS 2, NMOS 3, . . . , NMOS n) are used.

The offset provision portion 3 is structured by offset adders 22, 23, . . . , 2n, to which a control signal 40 and each of offset voltages (−Voff2, −Voff3, . . . , −Voffn) are inputted as an offset signal 50, respectively.

Each of gain amplifiers 11 to 1n is connected to the gate 6 (input terminal for operation control) of each N-type MOS transistor 4. The offset adders 22, 23, . . . , 2n are connected to the second and subsequent gain amplifiers 12 to 1n, respectively.

Also, the input side of the gain amplifier 11 of the first stage and the input side of the offset adders 22, 23, 2n are connected to an input terminal 30 (gate terminal G) to which the control signal 40 is inputted.

Hereafter, the configuration of each part will be described in detail.

The n pieces of N-type MOS transistors 4, each comprising a variable resistance in the same element size, are connected in parallel so as to control the gate voltage of each N-type MOS transistor individually.

The gate voltage of the first N-type MOS transistor (NMOS 1) is generated based on the control signal 40 amplified by the gain amplifier 11.

The gate voltage of the second N-type MOS transistor (NMOS 2) is generated by adding the offset voltage −Voff 2 to the control signal 40 and amplifying the added control signal 40 by the gain amplifier 12.

The gate voltage of the third N-type MOS transistor (NMOS 3) is generated by adding the offset voltage −Voff 3 to the control signal 40 and amplifying the added control signal 40 by the gain amplifier 13.

The gate voltage of the n-th N-type MOS transistor (NMOS n) is generated by adding the offset voltage −Voff n to the control signal 40 and amplifying the added control signal 40 by the gain amplifier 1n.

Figure 5:
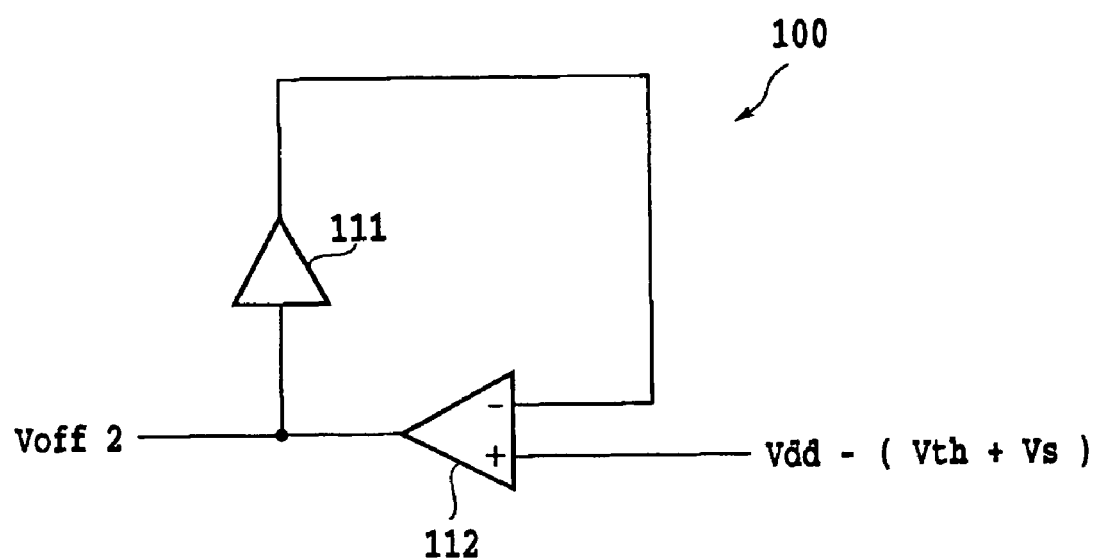
FIG. 5 is a circuit diagram showing an example of an offset signal generating circuit for generating an offset signal.

FIG. 5 shows an example of an offset signal generating circuit 100 for generating an offset signal 52 (offset voltage: −Voff 2) inputted to the offset adder 22.

The offset signal generating circuit 100 is structured by a gain amplifier 111 and a differential amplifier 112.

The differential amplifier 112 keeps an output of the gain amplifier 111 equal to (Vdd−(Vth+Vs)). The output of the differential amplifier 112 is inverted and added to the input of the gain amplifier 12. Assuming that the control signal 40 increases and the gain amplifier 111 has the same gain as the gain amplifier 11. When the output of the gain amplifier 11 reaches (Vdd−(Vth+Vs)), the output of the gain amplifier 12 starts to increase.

Provided that the gain amplifiers 11 and 12 have the same gain, when the output of the gain amplifier 11 reaches Vdd, the output of the gain amplifier 12 becomes (Vs+Vth).

An offset signal 53 (offset voltage: −Voff 3) inputted to the offset adder 23 can be generated such that the output of the differential amplifier 112 is obtained when the gain of the gain amplifier 111 of the offset signal generating circuit 100 shown in FIG. 5 is made to be the same as that of the gain amplifier 12 in FIG. 4, and the obtained output is inverted and added to the offset voltage −Voff 2 which is added to the input of the gain amplifier 12.

Provided that the gain amplifier 12 and the gain amplifier 13 have the same gain, when the output of the gain amplifier 12 reaches Vdd, the output of the gain amplifier 13 becomes (Vs+Vth).

Hereinafter similarly, each offset can be obtained by adding the inverted output generated by using the same circuit of FIG. 5 to the offset voltage according to a preceding number.

In the case where each of the gain amplifiers 11, 12, 13, . . . , 1n has the same gain, Voff 3 is generated by doubling the output of the offset generating circuit 100 of FIG. 5, and Voff n is also generated by multiplying the output of the offset generating circuit 100 by (n−1).

(Circuit Operation)

The operation of the variable resistance circuit 1 will be described.

Figure 6:
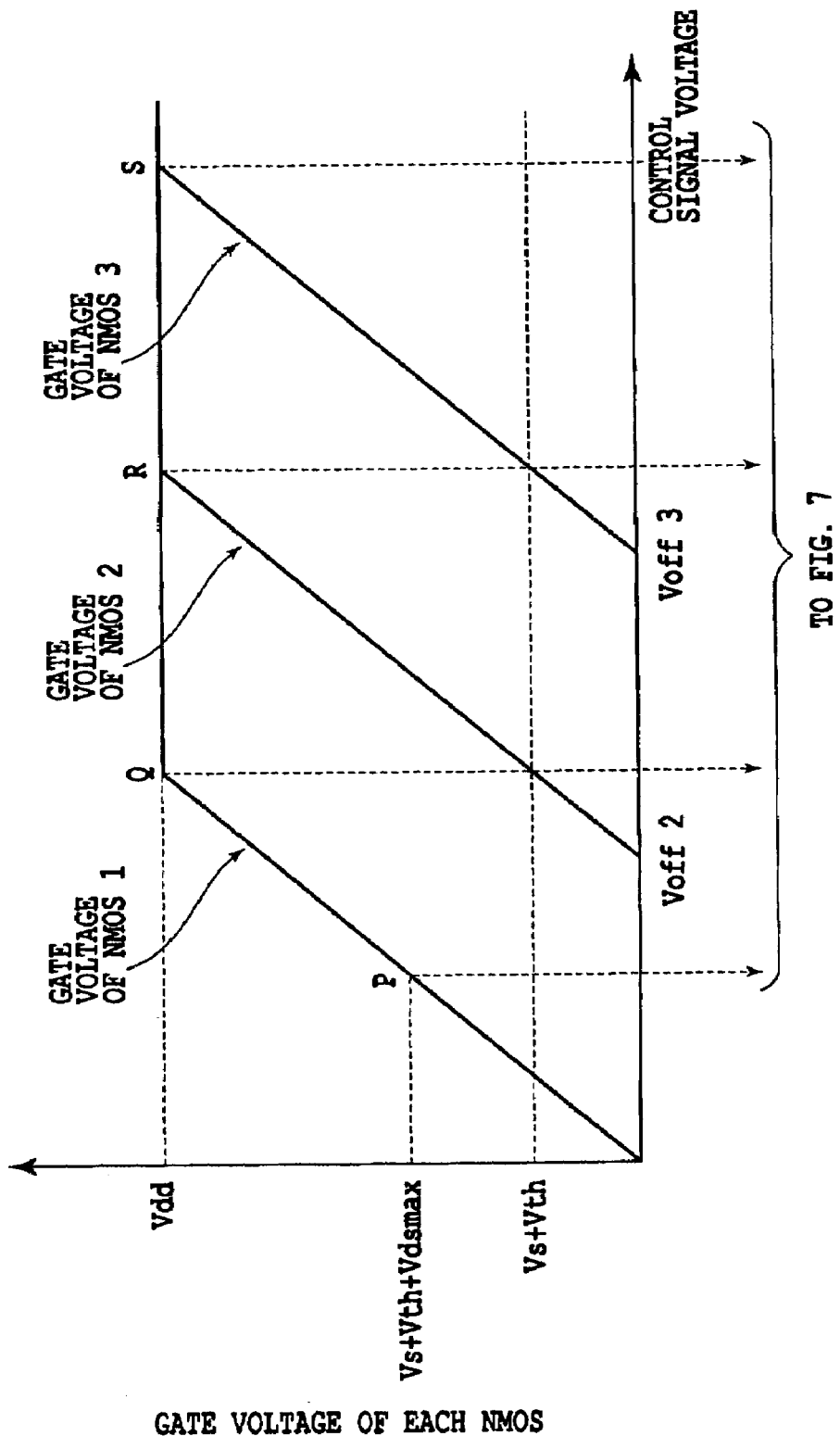
FIG. 6 is a graph showing a relationship between the gate voltage of each N-type MOS transistor and the control signal voltage.

FIG. 6 shows a relationship between the gate voltage of each N-type transistor 4 and a control signal voltage as the control signal 40.

Figure 7:
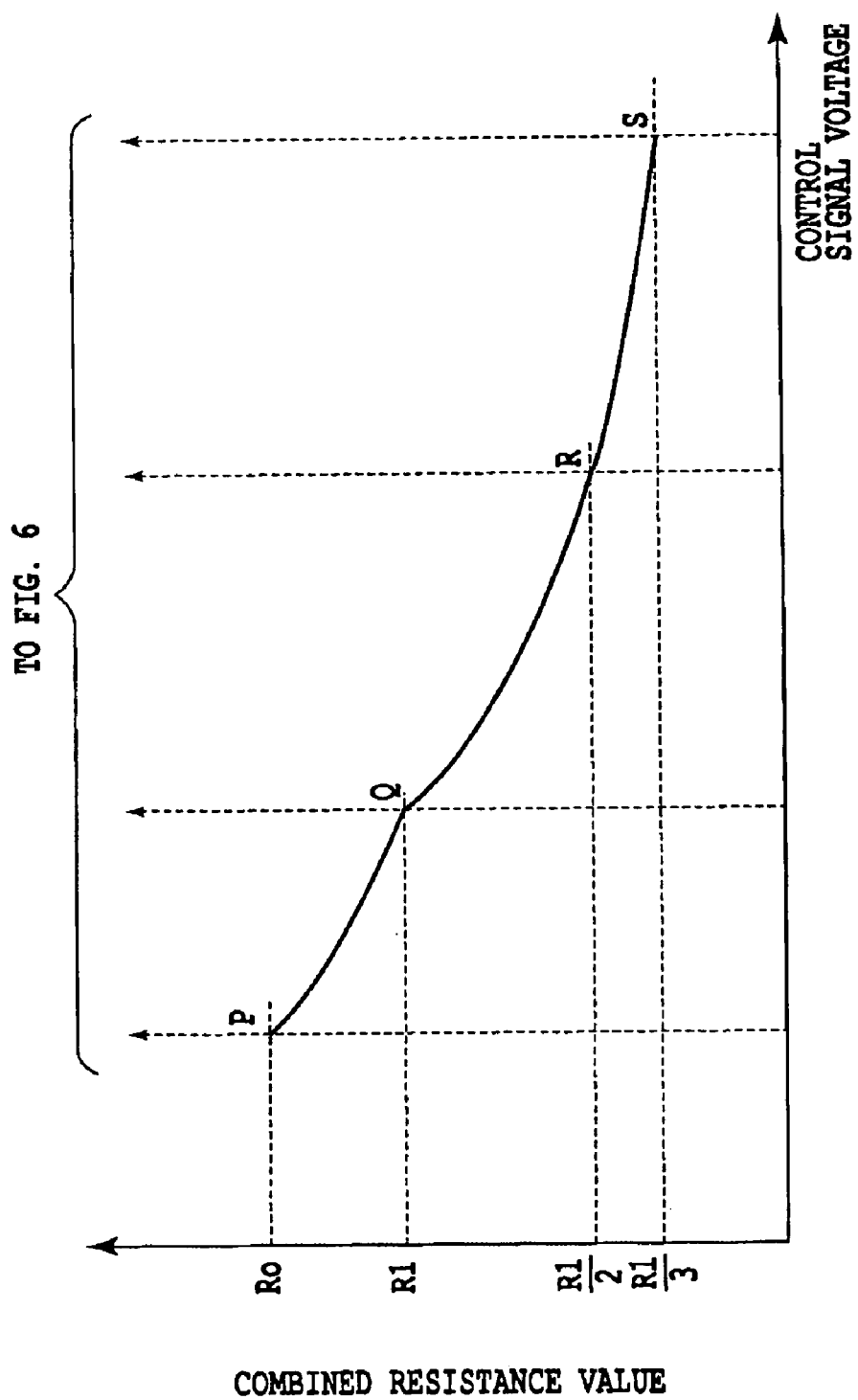
FIG. 7 is a graph showing a relationship between a combined resistance value of the variable resistance at the output terminal and the control signal voltage.

FIG. 7 shows a relationship between a combined resistance of the variable resistance observed at the pair of terminals 5 and the control signal voltage.

In FIG. 6, the NMOS 1 operates in a linear region that a voltage value is obtained by subtracting the threshold voltage Vth of N-type MOS transistor 4 from the voltage difference (Vg−Vs) between the gate voltage Vg and the source voltage Vs of NMOS 1, and the obtained voltage value exists in a voltage range expressed by (Vg−Vs−Vth>Vdsmax) which is larger than the maximum value Vdsmax of the source-drain voltage difference which corresponds to the voltage difference across the variable resistor.

For this reason, NMOS 1 becomes effective as the resistance when Vg is equal to or larger than (Vs+Vth+Vdsmax). In FIG. 7, when Vg becomes (Vs+Vth+Vdsmax) (at point P), the resistance value is defined as R0.

As the gate voltage of NMOS 1 becomes higher with the increase of the control signal voltage, the resistance value decreases. When the gate voltage of NMOS 1 reaches Vdd (point Q), the combined resistance value decreases to R1. At this time, the gate voltage of NMOS is increased within a limitation (of power supply voltage value Vdd, in general).

Then, as shown in FIG. 6, when the gate voltage of NMOS irises to the limited voltage value, the offset voltage −Voff 2 is added through the offset adder 22 to the input of the gain amplifier 12 for controlling the gate voltage of NMOS 2 such that a value obtained by subtracting Vs and Vth from the gate voltage of the second N-type MOS transistor (NMOS 2) reaches 0.

Thus, even if the decrease of the resistance value by NMOS 1 reaches the limit, the combined resistance value remains decreasing because the resistance of NMOS 2 starts to decrease. When the decrease of the combined resistance value by NMOS 1 and NMOS 2 reach the limit (point R), the combined resistance value decreases to R1/2.

Then, when the gate voltage of NMOS 2 reaches the limited voltage value, the offset voltage −Voff 3 is added through the offset adder 23 to the input of the gain amplifier 13 for controlling the gate voltage of NMOS 3 such that a value obtained by subtracting Vs and Vth from the gate voltage of the third N-type MOS transistor (NMOS 3) reaches 0.

Thus, even if the decrease of the resistance value by NMOS 2 reaches the limit, the combined resistance value remains decreasing because the resistance of NMOS 3 starts to decrease. When the decrease of the combined resistance value by NMOS 1, NMOS 2 and NMOS 3 reaches the limit (point S), the combined resistance value decreases to R1/3.

As described above, when the gate voltage of the preceding stage N-type MOS transistor 4 reaches the limit, a value obtained by subtracting Vs and Vth from the gate voltage of the subsequent stage N-type MOS transistor 4 reaches 0.

By controlling in such a manner, the resistance value becomes smaller each time the subsequent stage NMOS transistor 4 starts to operate.

In FIG. 6, the offset voltage is taken such that in the case where the gain of each gain amplifier is set to be the same, when the gate voltage of the preceding stage N-type transistor reaches the limit, the subsequent stage N-type MOS transistor 4 starts to operate. However, the gain of each gain amplifier may be set individually and the offset voltage may be taken arbitrarily.

The offset voltage is set to a value that the subsequent stage N-type MOS transistor 4 starts to operate, before the gate voltage of the preceding stage N-type transistor 4 reaches the upper limit, or more preferably, when the gate voltage of the preceding stage N-type transistor 4 reaches the upper limitation. However, if a dead zone (i.e. unchanged part of the resistance value) is allowed to be generated in relation to the control signal, the gate voltage of the subsequent stage N-type MOS transistor 4 may be made to start to operate after the gate voltage of the preceding stage N-type transistor 4 has perfectly risen to the limit.

Figure 8:
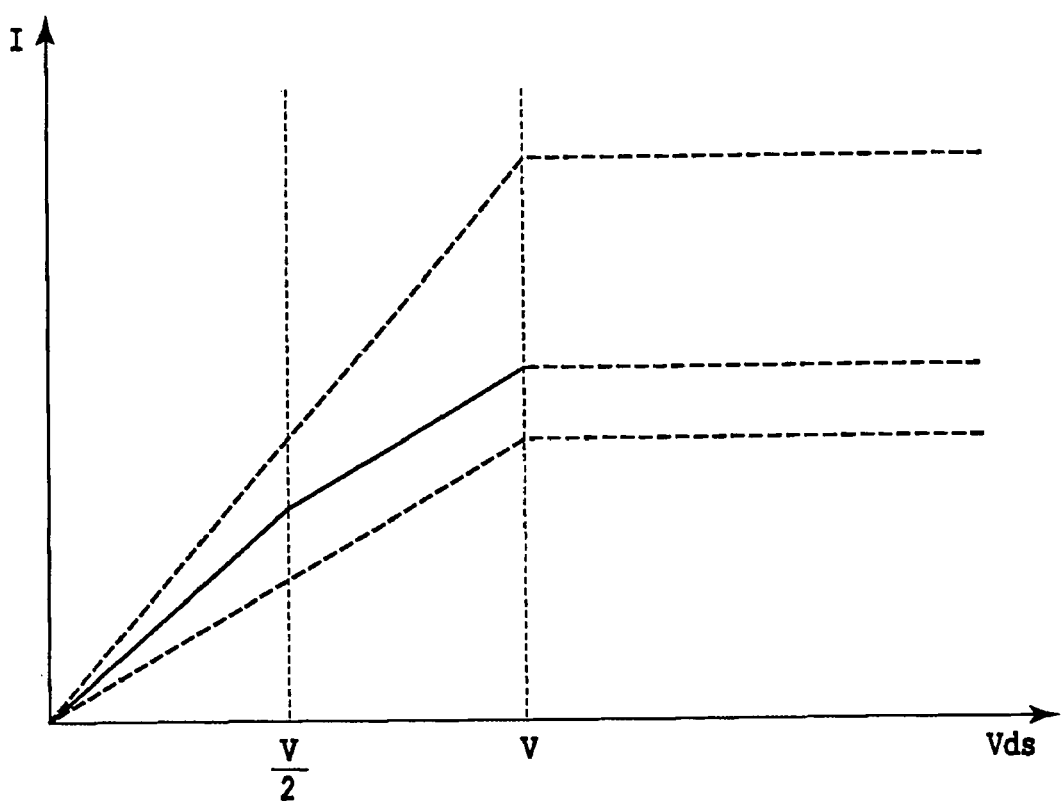
FIG. 8 is a graph showing a relationship between a voltage across a variable resistance portion and a current.
Figure 9:
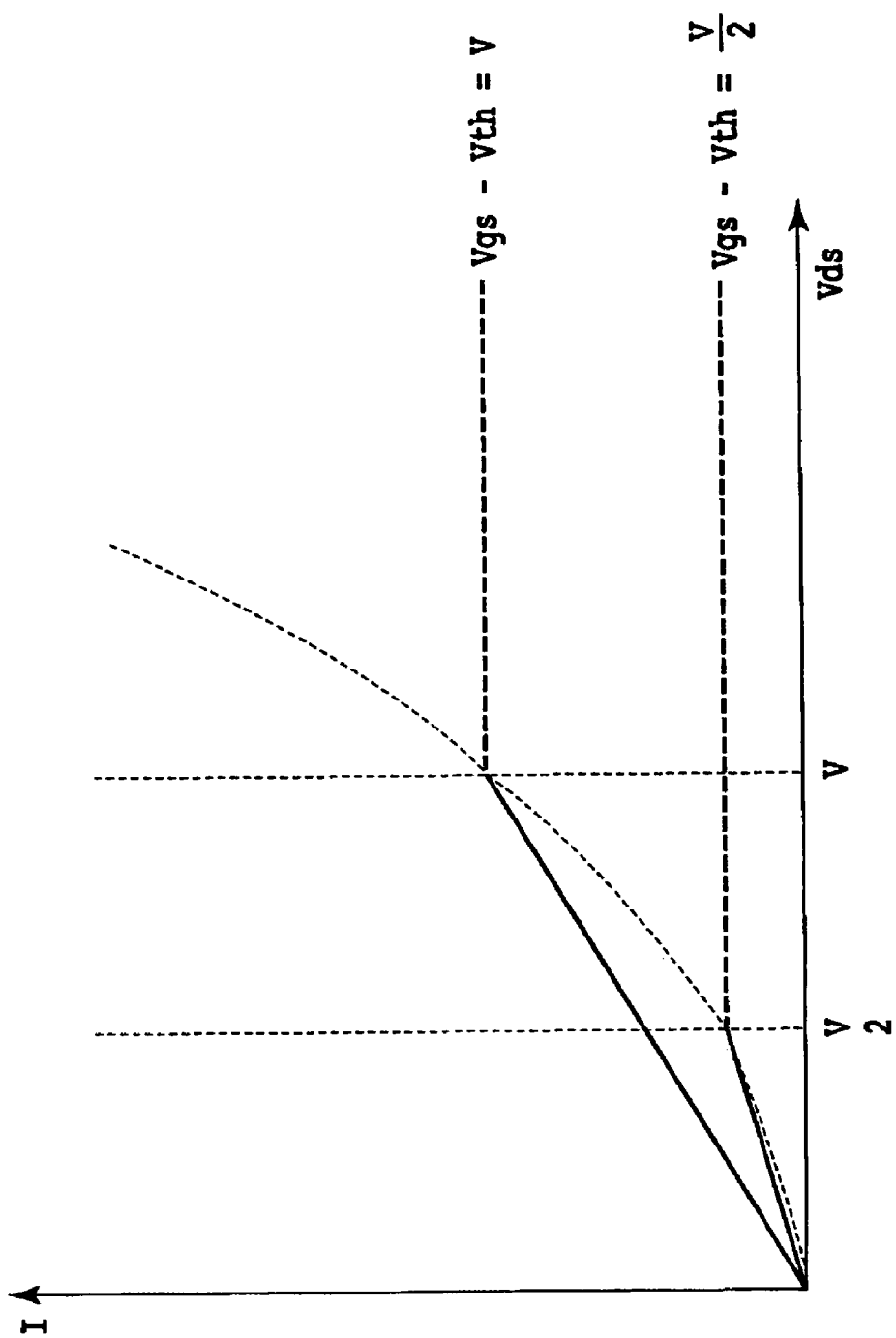
FIG. 9 is a graph showing a relationship between the gate-source voltage and the source-drain current of the MOS transistor.

FIGS. 8 and 9 show a relationship between a current I flowing through the variable resistance and Vds of NMOS transistors 4.

In FIG. 8, there exists an area in which (Vgs−Vth) of NMOS 2 is smaller than Vdsmax, in the case where the gate voltage of NMOS 2 starts to operate after the gate voltage of NMOS 1 has perfectly risen. Here, there is shown an example of the case where Vdsmax is V and (Vgs−Vth) of NMOS 2 is V/2.

As shown in FIG. 9, when Vds of NMOS 2 is smaller than V/2, I increases according to the increase of Vds. In contrast, when Vds becomes larger than (Vgs−Vth), NMOS 2 is saturated, and thus the flowing current is not increased and remains constant.

However, in the variable resistance as a whole, although the slope of I with respect to Vds is reduced, the value of I also increases according to the increase of Vds.

The value of Vds, in which the current flowing through NMOS 2 remains constant, increases with the value of (Vgs−Vth) of NMOS 2, and thus the value of current flowing through the variable resistance at the point of Vdsmax increases with Vgs of NMOS 2. Accordingly, the function as the variable resistance is performed as a whole even in the region where (Vgs−Vth) of NMOS 2 is smaller than Vdsmax.

In the example shown in FIG. 4, since each N-type MOS element is of the same size, when NMOS 2 reaches the limitation, the resistance value becomes R1/2 based on the lower limit resistance value R1 of NMOS 1, and when NMOS 3 reaches the limit, the resistance value becomes R1/3, and when NMOS n reaches the limit, the resistance value becomes R1/n. Since the maximum resistance value is the maximum resistance value R0 of NMOS 1, the ratio between the maximum and minimum resistance values becomes (n×R0/R1).

Since the element size of each MOS transistor may be set arbitrarily, for example, when a variable resistance is constituted by three MOS transistors, each being sized based on the ratio of 1:2:6, the ratio between the maximum and minimum resistance values becomes 9.

As described above, since the input value of the control signal 40 inputted to the gate 6 of each of N-type MOS transistors 4 constituting the variable resistance portion 2 can be varied based on the offset signal 50 outputted from the offset provision portion 3, the variable range of the combined resistance at the pair of terminals 5 can be wider.

Accordingly, the ratio of the maximum and minimum values of the combined resistance at the output terminal 5 of the variable resistance portion 2 can be made larger by several times or more than the conventional case, with a limited power supply voltage range being used as a control range.

This example according to the present embodiment is performed by using N-type MOS transistors 4, but P-type MOS transistors can also be used. In this case, it is necessary that polarity of the control voltage and the offset etc is inverted.

Second Embodiment

The second embodiment according to the present invention will be described with reference to FIGS. 10 to 12. Here, the same parts as in the above described first embodiment are denoted by the same reference numerals and the explanation thereof is omitted.

Figure 10:
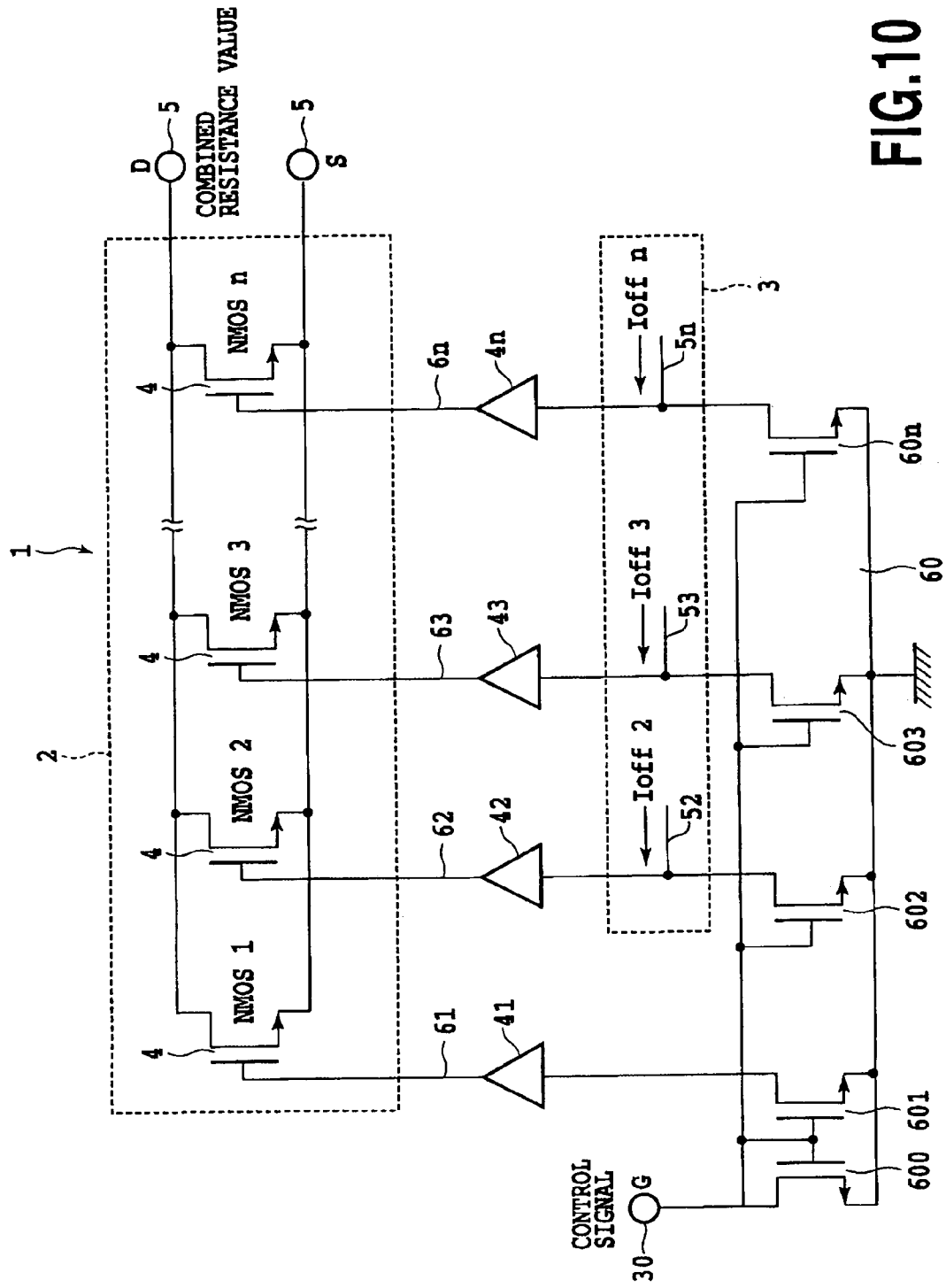
FIG. 10 is a circuit diagram showing a second embodiment of the variable resistance circuit according to the present invention.

FIG. 10 shows a configuration of a variable resistance circuit 1.

A control signal is mirrored by a mirror circuit 60 and current of N-type MOS transistor 600 is mirrored in each of N-type transistors 602, 603, . . . , 60n, respectively.

An offset provision portion 3 is connected to the drain of N-type transistors of the mirror circuit 60, and supplies offset currents (Ioff2, Ioff3, . . . , Ioffn) as offset signals 52, 53, . . . , 5n.

A circuit for generating the offset current can be realized, for example, by means of a circuit arrangement in which the gain amplifier 111 and the differential amplifier 112 in the above described circuit as shown in FIG. 5 are replaced by an I-V converting circuit and a current output type differential amplifier, respectively. In this circuit, two output currents of the differential amplifier are generated by a mirror circuit, one of which output current is used for the I-V converting circuit and the other of which output current is used as an output in this circuit arrangement.

Hereafter, the operation of the circuit will be described.

Figure 11:
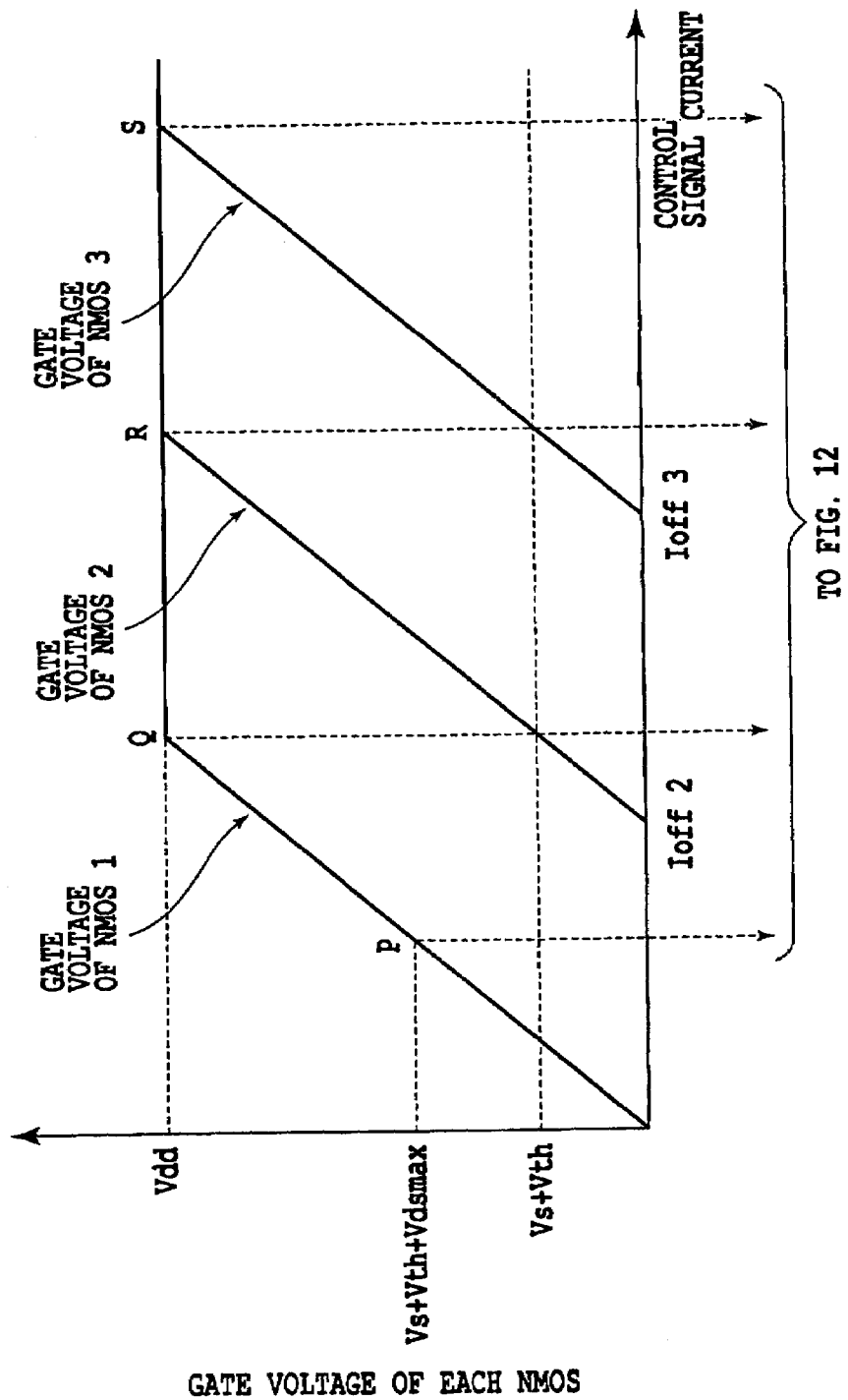
FIG. 11 is a graph showing a relationship between the gate voltage of each N-type MOS transistor and a control signal current.

FIG. 11 shows a relationship between the gate voltage of each N-type MOS transistor 4 and a control signal current serving as the control signal 40.

Figure 12:
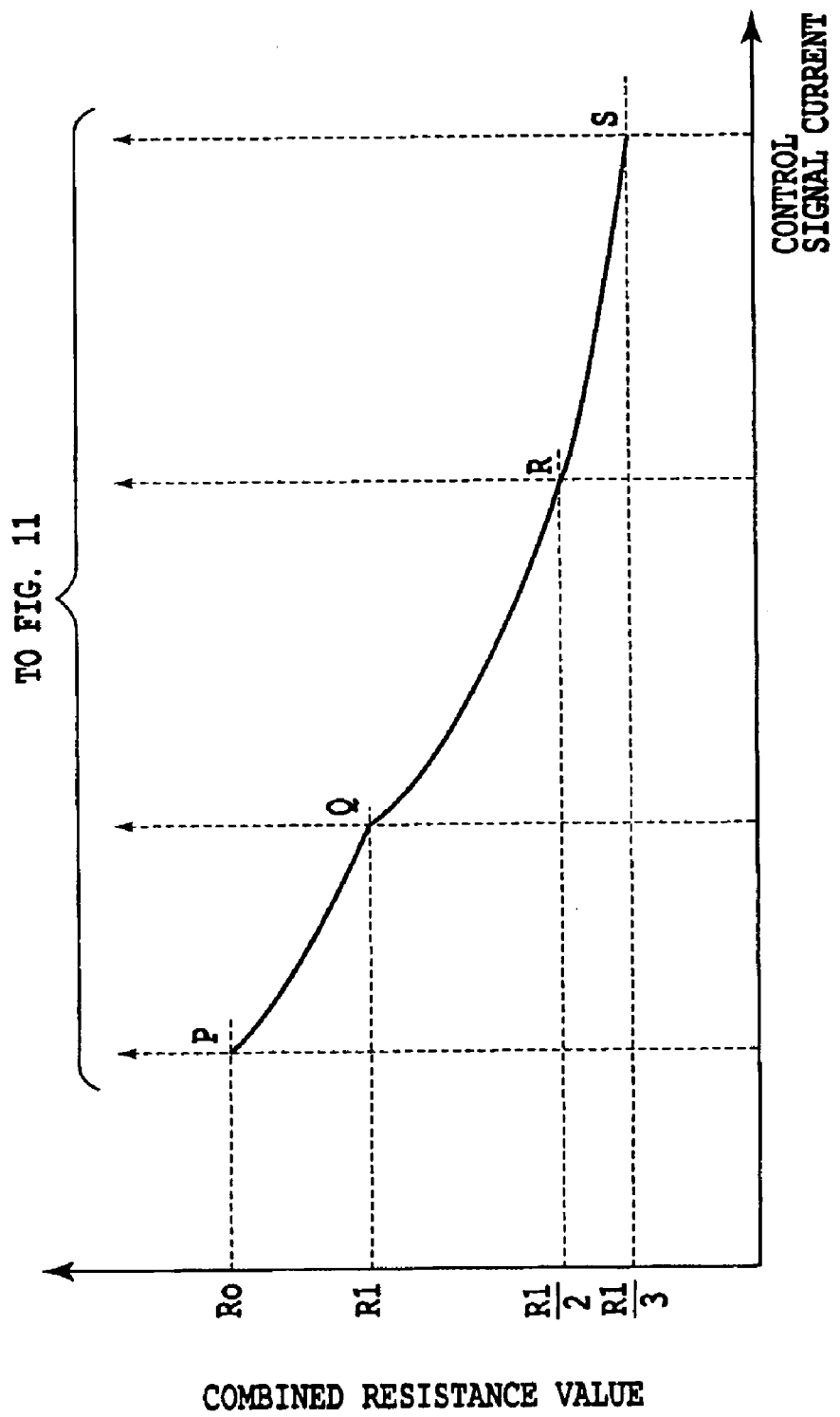
FIG. 12 is a graph showing a relationship between the combined resistance of the variable resistance at the output terminal and the control signal current.

FIG. 12 shows a relationship between a combined resistance value of the variable resistance observed at the pair of terminals 5, and the control signal current.

In this example according to the present embodiment, the control of resistance value of each N-type MOS transistor 4 of the variable resistance portion 2 is performed based on a current from the offset provision portion 3 and the mirrored current.

A control current 40 is reproduced by the mirror circuit 60, to which control current each of the offset currents (Ioff2, Ioff3, . . . , Ioffn) is added for each mirror destination. As a result, relationships as shown in FIGS. 11, 12 can be obtained such that the drain current of N-type MOS transistor 601 of the mirror circuit 60 and a current obtained by subtracting each of the offset currents from each drain current of N-type MOS transistors 602, 603, . . . , 60n are converted so as to perform the I-V conversion through each of the I-V converting circuits 41, 42, 43, . . . , 4n, and the gate voltage of the MOS resistance of each N-type MOS transistor 4 is controlled.

Figure 1:
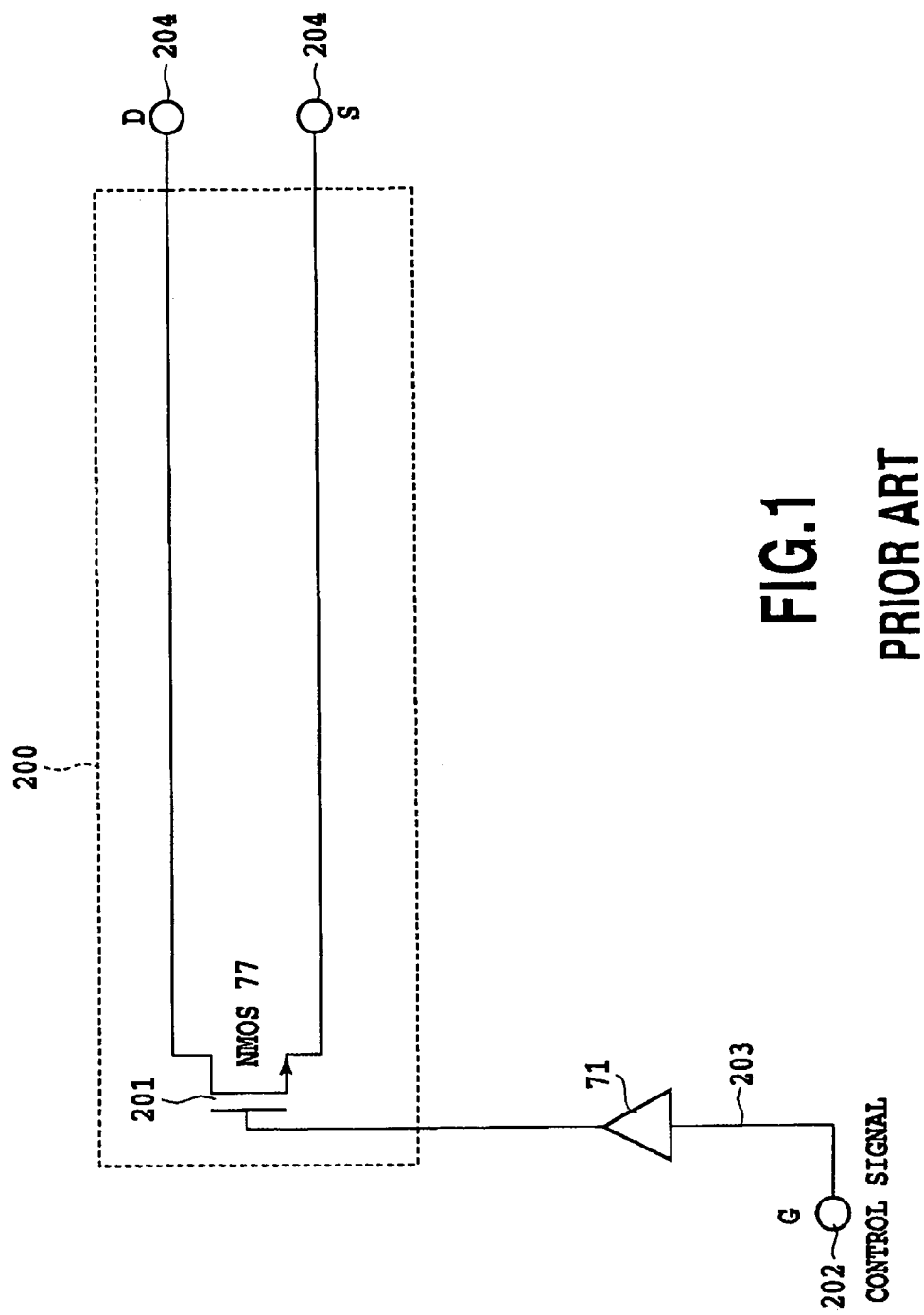
FIG. 1 is a circuit diagram showing a configuration of a conventional variable resistance circuit.
Figure 2:
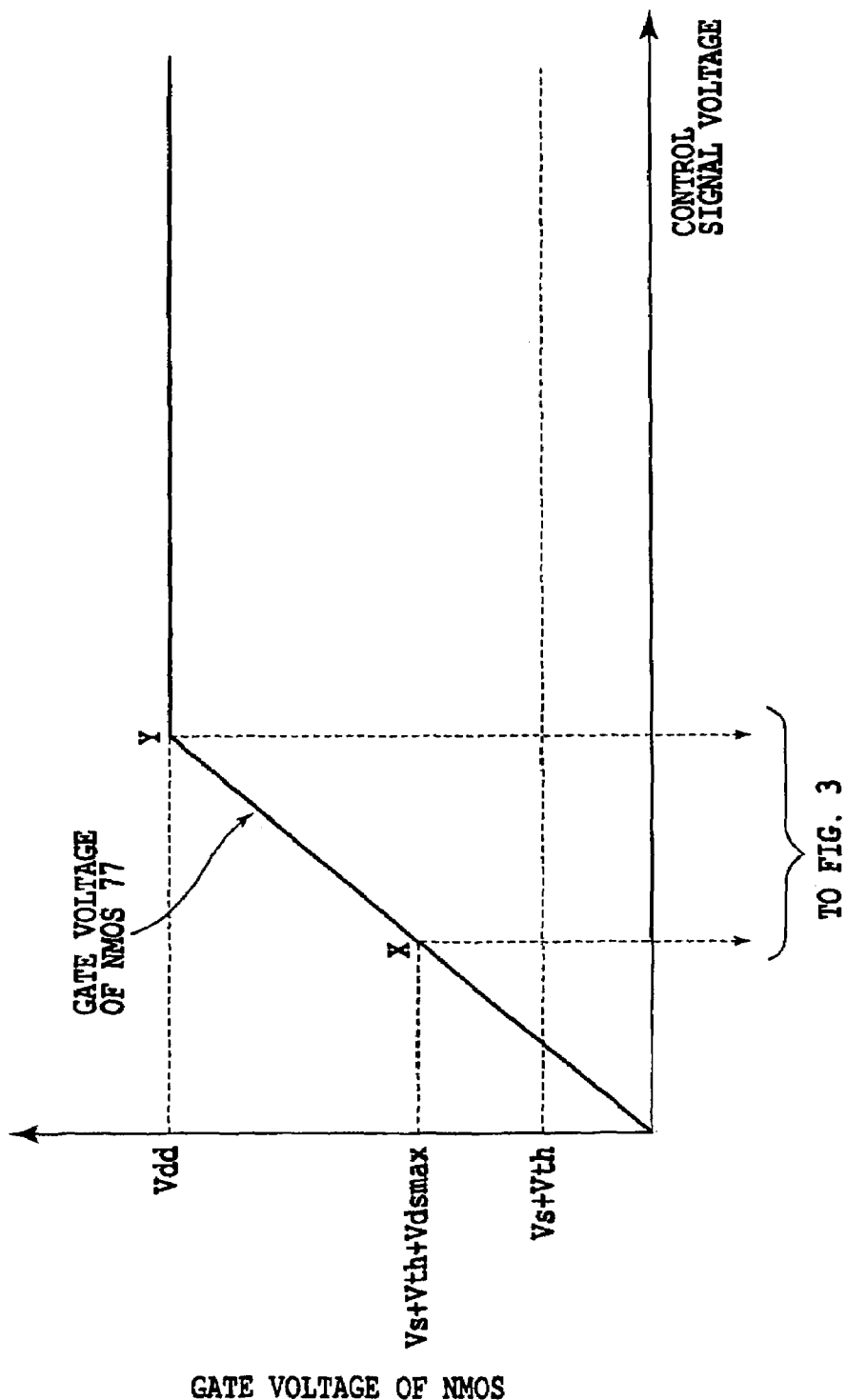
FIG. 2 is a graph showing a relationship between a gate voltage of an N-type MOS transistor and a control signal voltage.
Figure 3:
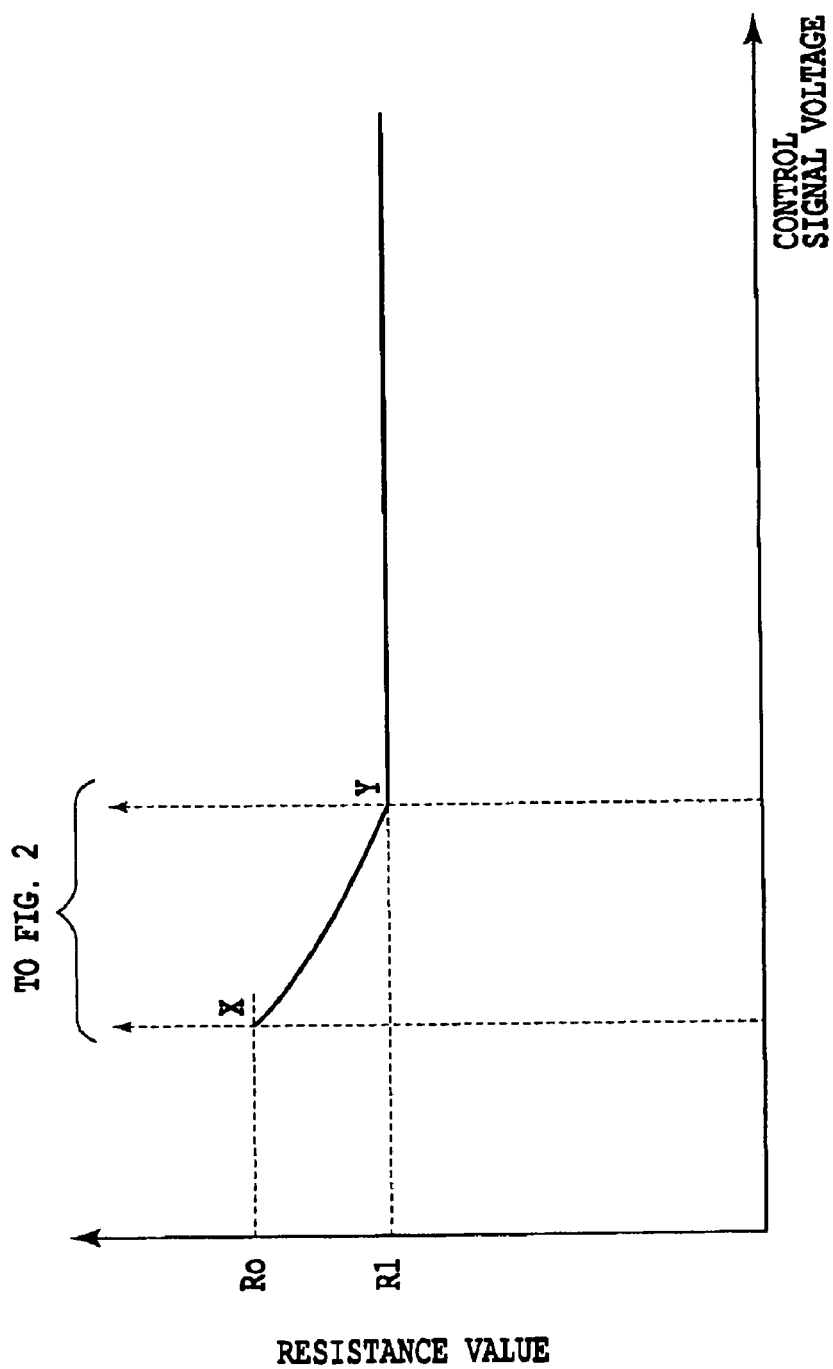
FIG. 3 is a graph showing a relationship between a combined resistance value at an output terminal and the control signal voltage.

Since the FIGS. 11, 12 can be explained similarly to FIGS. 3, 4, the detailed explanation thereof is omitted.

Third Embodiment

Figure 13:
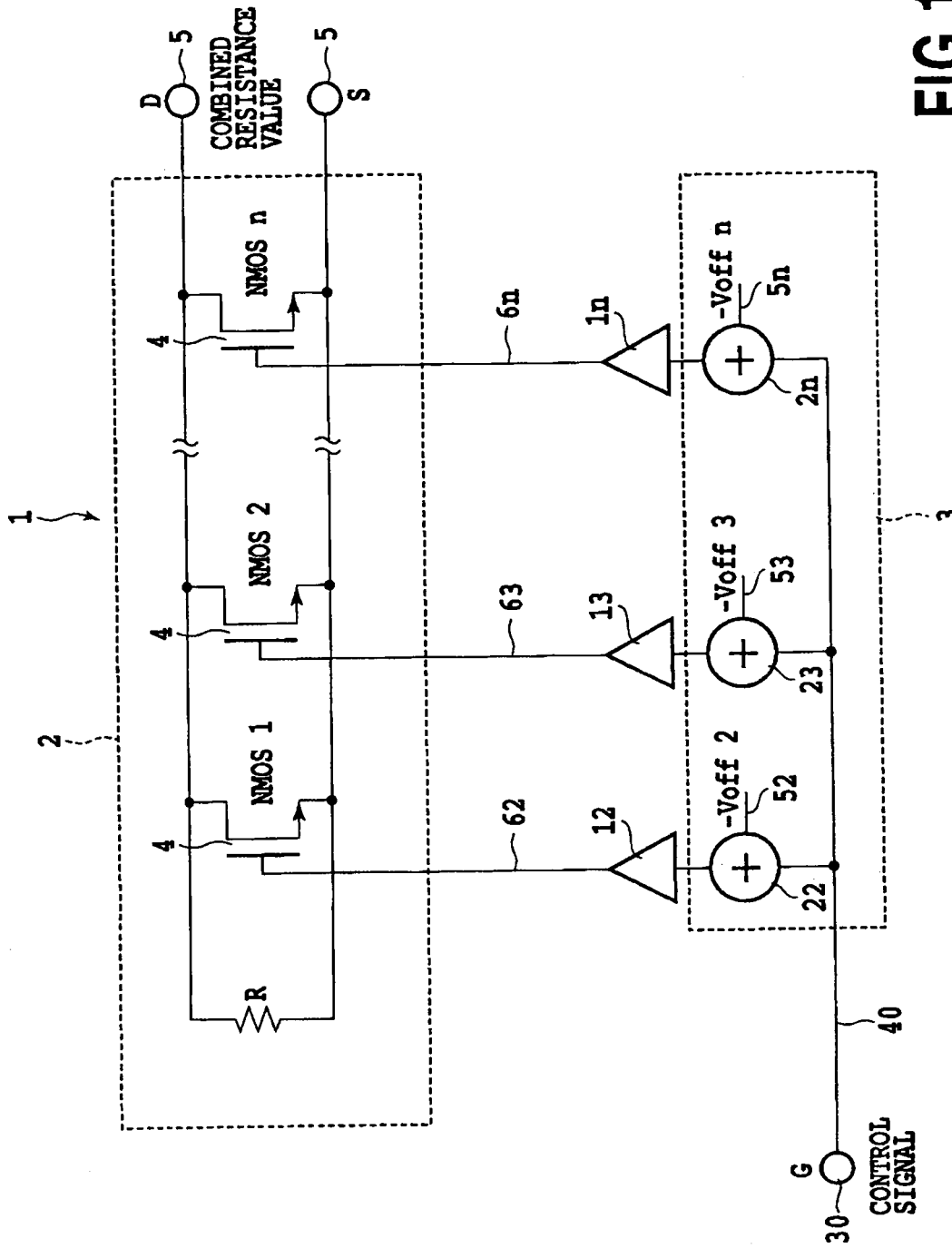
FIG. 13 is a circuit diagram showing a third embodiment of the variable resistance circuit according to the present invention.

A third embodiment according to the present invention is described with reference to FIGS. 13 to 15. Here, the same parts as in the above described first embodiment are denoted by the same reference numerals and the explanation thereof is omitted.

The present embodiment is an example in which the first stage transistor element 4 (NMOS 1) constituting the variable resistance portion 2 of the first embodiment is replaced by a fixed value resistance R.

Figure 14:
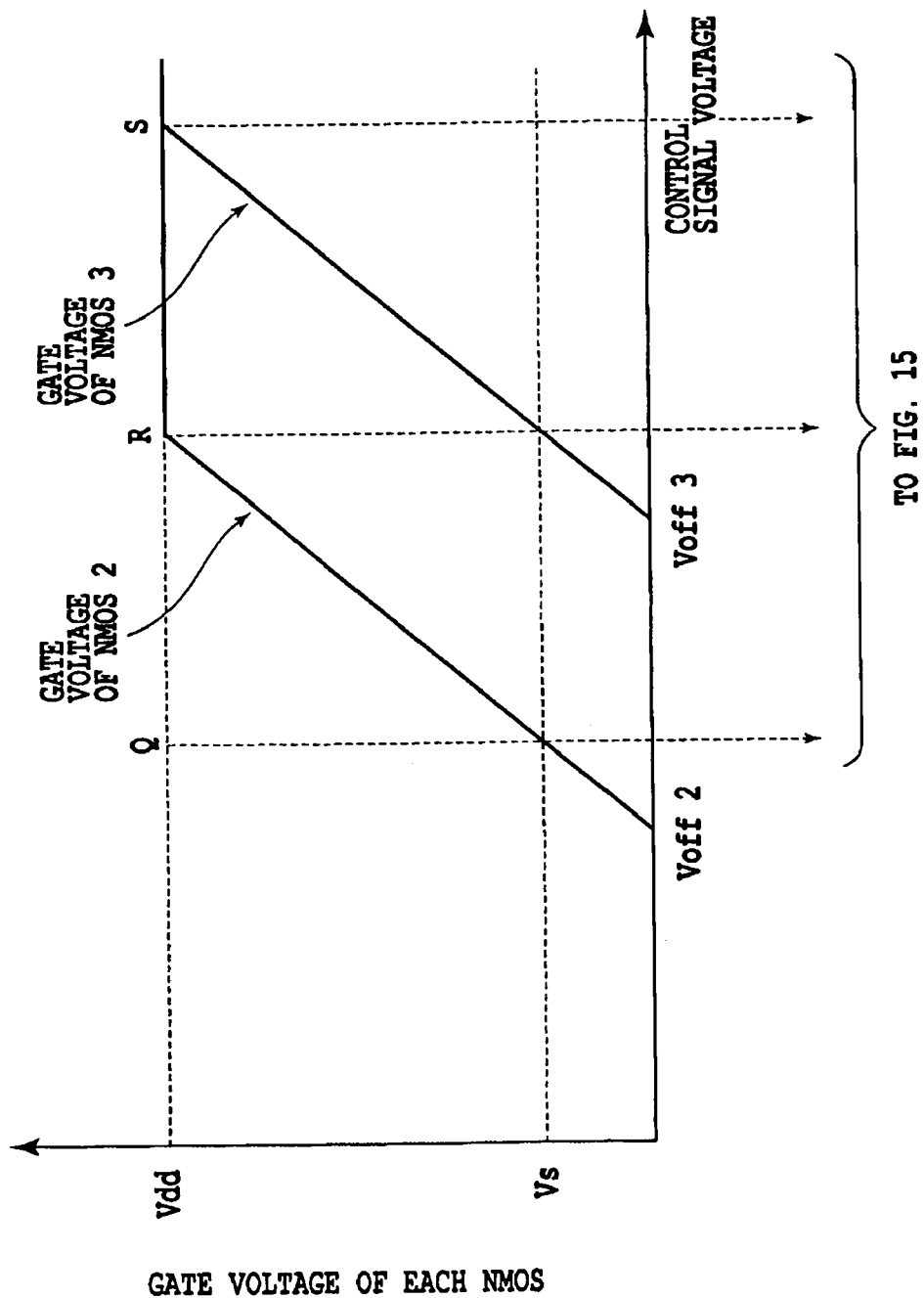
FIG. 14 is a graph showing a relationship between the gate voltage of each N-type MOS transistor and a control signal voltage.

FIG. 14 shows a relationship between the gate voltage of each N-type MOS transistor 4 and a control signal voltage as the control signal 40.

Figure 15:
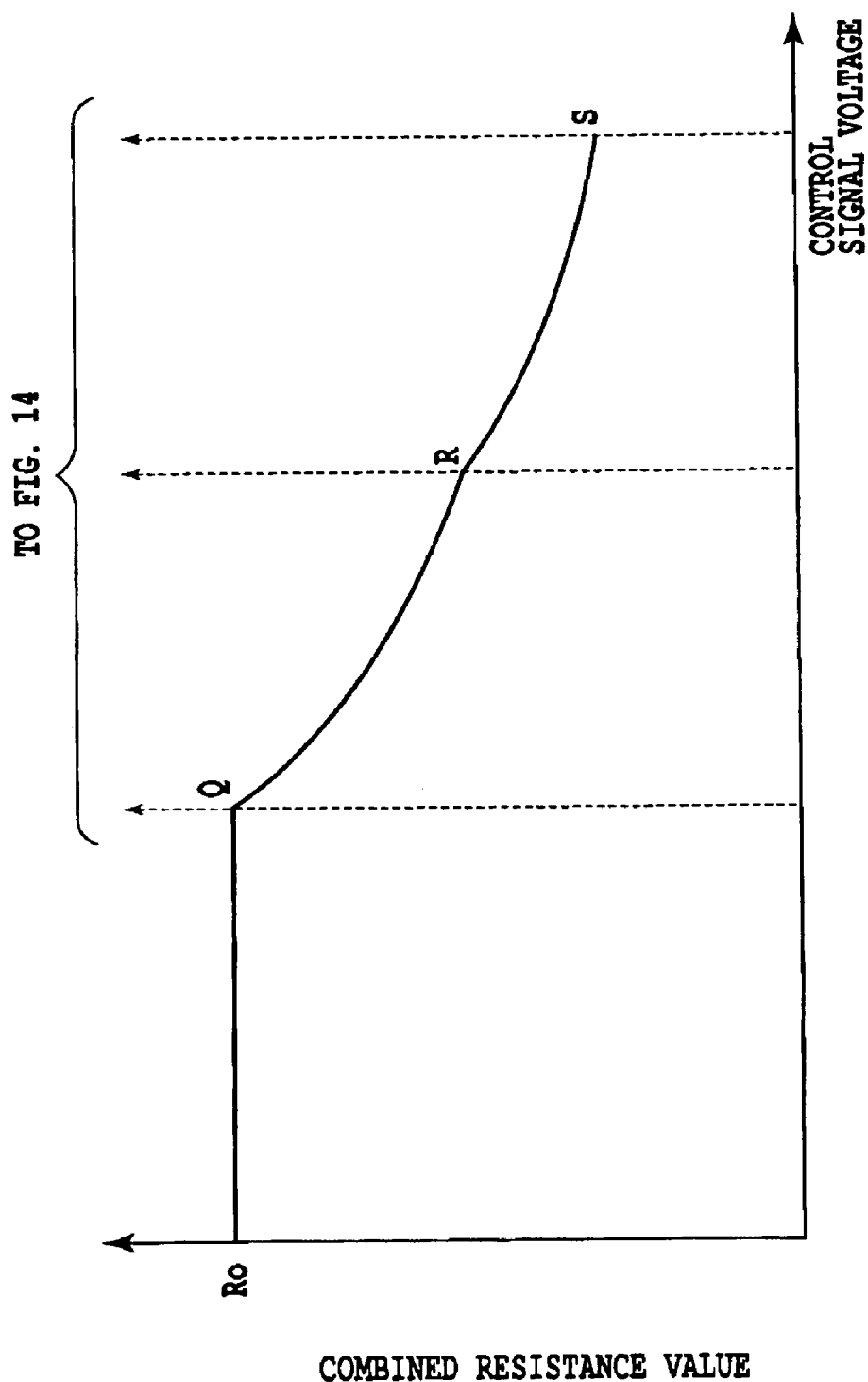
FIG. 15 is a graph showing a relationship between the combined resistance of the variable resistance at the output terminal and the control signal voltage.

FIG. 15 shows a relationship between a combined resistance of the variable resistance at the output terminal 5 and the control signal voltage.

Since the resistance of R is fixed, operations are the same as the operations of the variable resistance circuit 1 according to the first embodiment, except that the resistance value of NMOS 1 is not changed.

In this way, the use of the fixed value resistance R instead of NMOS 1, eliminates a limitation on the voltage condition for enabling NMOS 1 to operate in a linear region, as a result of which input adjustment for making the control signal 40 provided with the offset signal can be correspondingly simplified.

The present invention has been described in detail with respect to preferred embodiments, and it will now be apparent from the foregoing to those skilled in the art that changes and modifications may be made without t departing from the invention in its broader aspect, and it is the intention, therefore, in the apparent claims to cover all such changes.

What is claimed is:

1. A variable resistance circuit comprising:
   a variable resistance portion having a plurality of transistor elements connected in parallel and having a pair of terminals to provide a combined resistance of said transistors; and
   an offset provision portion for adding an offset signal to a control signal to control each of said transistor elements, said control signal inputted from a control terminal,
   wherein the said control signal added said offset signal varies said combined resistance between said pair of terminals.

2. The variable resistance circuit according to claim 1, said variable resistance portion further comprises a fixed resistance element to said transistor elements in parallel.

3. The variable resistance circuit according to one of claim 1 and claim 2, wherein said transistor elements of said variable resistance portion comprise MOS transistors.

4. The variable resistance circuit according to one of claim 1 and claim 2, wherein said offset signal is a voltage signal for adding to an input voltage inputted to said input terminal as said control signal.

5. The variable resistance circuit according to one of claim 1 and claim 2, wherein said offset signal is a current signal for adding to an input current inputted to said input terminal as said control signal.

* * * * *